(12) United States Patent
Watanabe

(10) Patent No.: US 7,227,206 B2
(45) Date of Patent: Jun. 5, 2007

(54) SOLID-STATE IMAGE SENSOR, PRODUCTION METHOD FOR SOLID-STATE IMAGE SENSOR, AND CAMERA USING SOLID-STATE IMAGE SENSOR

(75) Inventor: Takanori Watanabe, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 87 days.

(21) Appl. No.: 10/842,443

(22) Filed: May 11, 2004

(65) Prior Publication Data

US 2005/0006676 A1   Jan. 13, 2005

(30) Foreign Application Priority Data

May 15, 2003   (JP) .............. 2003-137440

(51) Int. Cl.
*H01L 27/146* (2006.01)

(52) U.S. Cl. ............... 257/292; 257/291; 257/E27.133

(58) Field of Classification Search ........ 257/290, 257/291, 292, E27.133; 438/48
See application file for complete search history.

(56) References Cited

U.S. PATENT DOCUMENTS

| | | | |
|---|---|---|---|
| 5,471,515 A | 11/1995 | Fossum et al. ............... 377/60 |
| 5,675,158 A | 10/1997 | Lee ............................. 257/233 |
| 5,841,126 A | 11/1998 | Fossum et al. .......... 250/208.1 |
| 5,892,253 A | 4/1999 | Merrill ........................ 257/292 |
| 5,977,576 A | 11/1999 | Hamasaki |
| 6,023,081 A | 2/2000 | Drowley et al. |
| 6,118,142 A * | 9/2000 | Chen et al. ................. 257/232 |
| 6,127,697 A | 10/2000 | Guidash ........................ 257/292 |
| 6,320,200 B1 * | 11/2001 | Reed et al. ..................... 257/40 |
| 6,504,193 B1 | 1/2003 | Ishiwata et al. |
| 6,661,459 B1 | 12/2003 | Koizumi et al. ............. 348/310 |
| 6,683,349 B1 | 1/2004 | Taniguchi et al. |
| 6,706,550 B2 | 3/2004 | Lee et al. |
| 6,707,080 B2 * | 3/2004 | Wang et al. ................. 257/291 |
| 6,765,247 B2 * | 7/2004 | Beasom ...................... 257/288 |
| 2001/0030701 A1 | 10/2001 | Hiyama et al. ............. 348/304 |
| 2001/0054724 A1 | 12/2001 | Kamashita et al. |
| 2002/0022309 A1 | 2/2002 | Dierickx |
| 2004/0017496 A1 | 1/2004 | Koizumi et al. ............. 348/308 |

FOREIGN PATENT DOCUMENTS

| | | | |
|---|---|---|---|
| JP | 59-198756 | 11/1984 |
| JP | 8-335690 | 12/1996 |
| JP | 2000-091552 | * 11/1998 | .............. 27/146 |
| JP | 11-274454 | 10/1999 |
| JP | 11-274457 | 10/1999 |
| JP | 2000-091552 | 3/2000 |
| JP | 2001-245216 | 9/2001 |

* cited by examiner

*Primary Examiner*—Evan Pert
*Assistant Examiner*—Victor A. Mandala, Jr.
(74) *Attorney, Agent, or Firm*—Fitzpatrick, Cella, Harper & Scinto

(57) ABSTRACT

A solid-state image sensor includes, in each pixel, a p-type well provided on a semiconductor substrate, a photodiode provided in the p-type well, a transfer gate for transferring photocharges accumulated in the photodiode, and an n-type diffusion region for receiving the transferred photocharges. The photodiode includes a first n-type accumulation region, and a second n-type accumulation region having a concentration higher than that of the first accumulation region and provided at a position deeper than the first accumulation region. The first accumulation region extends toward an end of the transfer gate, and the second accumulation region is separate from the transfer gate.

7 Claims, 6 Drawing Sheets

SOLID-STATE IMAGE SENSOR, PRODUCTION METHOD FOR SOLID-STATE IMAGE SENSOR, AND CAMERA USING SOLID-STATE IMAGE SENSOR

BACKGROUND OF THE INVENTION

1. Field of the Invention

The present invention relates to a solid-state image sensor, a production method therefor, and a camera using a solid-state image sensor. More particularly, the present invention relates to a solid-state image sensor having a signal amplifier in each pixel, a production method therefor, and a camera including such an image sensor.

2. Description of the Related Art

Typical examples of solid-state image sensors are CCD sensors including photodiodes and CCD shift registers, and CMOS sensors in which a pixel section is constituted by active pixels each composed of a photodiode and an MOS transistor. CMOS sensors have the following advantages over CCD sensors:

(1) The power consumption is low.
(2) Since peripheral circuits can be mounted on a single chip, a signal-processing circuit can be provided on the same chip, and compact solid-state image sensors can be produced at low cost.
(3) Since the process design can be made based on a known MOS process, solid-state image sensors can be provided without using a special production line.

In order to obtain the above advantages, it is preferable that the power voltage does not substantially deviate from, for example, 5 V or 3.3 V that is standardized in the normal CMOS process. For this reason, there is a restriction on the gate voltage during a transfer operation for reading signal charges accumulated in a photodiode in each pixel, and it is not always easy to design a transfer structure for the signal charges accumulated in the photodiode. In particular, when a buried photodiode structure is adopted to limit dark current, and when a photodiode is completely depleted at the time of reset, in order to cancel the influence of reset noise, a structure for transferring charges in the photodiode cannot be easily achieved.

This problem will be described with reference to FIG. 7, which graphically illustrates a known solid-state image sensor. Referring to FIG. 7, the solid-state image sensor includes, in each pixel, a semiconductor substrate 701, a well 702 made of a p-type semiconductor in an image pickup region, a transfer gate 703 for transferring signal charges accumulated in a pixel to a diffusion region 704, a gate oxide 705, a p-type high-concentration layer 706, and an accumulation region 707 of a photodiode that is made of an n-type semiconductor and that is covered with the p-type high-concentration layer 706. The p-type high-concentration layer 706 is provided to prevent a depletion layer extending from the accumulation region 707 from reaching the gate oxide 705, and to thereby limit dark current. In such a buried photodiode, when being transferred to the diffusion region 704, charges in the accumulation region 707 must be transferred from a position deeply recessed from the gate oxide 705. In order to enable such transfer, a charge-transfer region 708 is provided. The gate voltage necessary for transfer is restricted by the concentration and width of the charge-transfer region 708. That is, as long as the concentration and width of the charge-transfer region 708 are satisfactory, charges in the photodiode can be completely transferred at a desired power voltage, the photodiode can be completely reset, and the signal charges can be completely transferred.

A method for forming the above-described structure is proposed in Japanese Patent Laid-Open No. 11-274454. The abstract and example of the proposal will be described briefly as follows:

(1) Stable production is allowed by forming a charge-transfer region with respect to a transfer gate in a self-alignment manner.
(2) The charge transfer region can be formed by thermally diffusing phosphorus as an ion species at the angle shown by arrow 709 in FIG. 7 during ion implantation for an accumulation region.
(3) As an example, an n-layer (accumulation region) and a charge-transfer region in the photodiode are formed by two ion implantation operations that are different in angle and energy. This can optimize the characteristics.

A structure capable of complete transfer can be achieved by forming a wide, high-concentration charge-transfer region by the above method. In this case, however, the following problem occurs. When the concentration and width of the charge-transfer region are excessively large, a depletion layer of the photodiode reaches the interface of a gate oxide during accumulation, in spite of the buried photodiode structure for reducing dark current, and dark current markedly increases. In order to solve this problem, an inversion layer is formed on the charge-transfer region by decreasing the voltage of the transfer gate electrode below the well voltage during accumulation (hereinafter, referred to as "transfer-gate low-level voltage"), as disclosed in Japanese Patent Laid-Open No. 2001-245216.

As described above, in the technique disclosed in Japanese Patent Laid-Open No. 11-274454, when the concentration and width of the charge transfer region are excessively large, a depletion layer of the photodiode reaches the interface of the gate oxide during accumulation, in spite of the buried photodiode structure for reducing dark current, and dark current markedly increases.

While the method disclosed in Japanese Patent Laid-Open No. 2001-245216 is highly effective, it is preferable, for lower power consumption and lower voltage, that the low-level voltage of the transfer gate be as close to the well voltage as possible.

SUMMARY OF THE INVENTION

Accordingly, an object of the present invention is to provide an inexpensive and high-definition solid-state image sensor that reduces power voltage and power consumption and that achieves a high S/N ratio.

According to one aspect, the present invention provides a solid-state image sensor including, in each pixel, a semiconductor region of a first conductive type provided on a semiconductor substrate, a photodiode provided in the semiconductor region, a transfer gate for transferring photocharges accumulated in the photodiode, a diffusion region of a second conductive type for receiving the transferred photocharges, wherein the photodiode includes a first accumulation region composed of a semiconductor of the second conductive type, and a second accumulation region provided in contact with the first accumulation region and at a position deeper than the first accumulation region, and composed of a semiconductor of the second conductive type having a concentration higher than that of the first accumulation region, and wherein the first accumulation region extends toward an end of the transfer gate, and the second accumulation region is separate from the transfer gate.

According to another aspect, the present invention provides a production method for a solid-state image sensor, wherein the solid-state image sensor includes, in each pixel, a semiconductor region of a first conductive type provided on a semiconductor substrate, a photodiode provided in the semiconductor region, a transfer gate for transferring photocharges accumulated in the photodiode, a diffusion region of a second conductive type for receiving the transferred photocharges, wherein the photodiode includes a first accumulation region composed of a semiconductor of the second conductive type, and a second accumulation region provided in contact with the first accumulation region and at a position deeper than the first accumulation region, and composed of a semiconductor of the second conductive type having a concentration higher than that of the first accumulation region, and wherein ion implantation for forming the first accumulation region satisfies $0° \leq \alpha < 90°$ and $270° < \alpha \leq 360°$, and ion implantation for forming the second accumulation region satisfies $90° \leq \alpha \leq 270°$, where α represents the angle defined between an x-axis indicating a gate length direction of the transfer gate, and a projected ion implantation direction obtained by projecting an ion implantation direction onto an xy-plane including the x-axis and a y-axis indicating a gate width direction of the transfer gate.

In the present invention, the photodiode includes two accumulation regions provided at different depths. The first shallow accumulation region has a charge-transfer region under the transfer gate, and the second deep accumulation region substantially does not have a concentration in a shallow area under the transfer gate and adjacent to a gate oxide.

In the production method for achieving the above structure, when the gate length direction of the transfer gate is designated as an x-axis, the gate width direction of the transfer gate is designated as a y-axis, and the angle formed between a projected ion implantation direction, which is obtained by projecting an ion implantation direction onto an xy-plane including the x-axis and the y-axis, and the x-axis is designated as α, ion implantation for forming the first accumulation region satisfies $0° \leq \alpha < 90°$ and $270° < \alpha \leq 360°$ and ion implantation for forming the second accumulation region satisfies $90° \leq \alpha \leq 270$. The first accumulation region has a charge-transfer region under the transfer gate, and the second accumulation region does not extend under the transfer gate.

In the production method, ion implantation for the first shallow accumulation region is performed at an angle to (preferably, parallel to) the gate length direction of the transfer direction, and ion implantation for the second deep accumulation region is performed at a tilt angle (preferably, parallel to) the gate width direction of the transfer gate.

According to the present invention, the concentration of the charge-transfer region can be controlled independently from the number of charges to be accumulated in the photodiode, and the depletion voltage, the concentration adjacent to the gate electrode can be reduced, and process variations during mass production are reduced. These advantages allow a solid-state image sensor to stably operate with a lower negative voltage and to reduce dark current.

Furthermore, it is possible to reduce the voltage applied to the transfer gate during transfer and the absolute value of the negative voltage applied to the transfer gate during accumulation. For this reason, the power voltage and power consumption are reduced and the SN ratio is improved. In addition, production stability is high, the ion implantation conditions can be flexibly determined, and the occurrence of white spots can be reduced. Consequently, the yield is improved, and an inexpensive and high-definition solid-state image sensor can be provided.

Further objects, features, and advantages of the present invention will become apparent from the following description of the preferred embodiments with reference to the attached drawings.

DESCRIPTION OF THE PREFERRED EMBODIMENTS

Embodiments of the present invention will be described in detail below with reference to the attached drawings.

First Embodiment

Figure 1A:
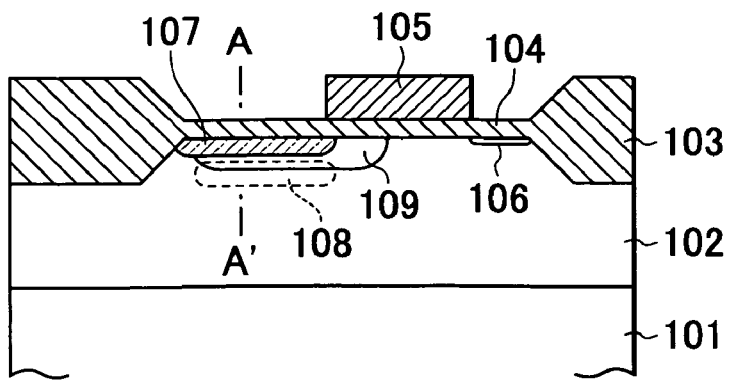
FIG. 1A is an explanatory view of a first embodiment of the present invention.
Figure 1B:
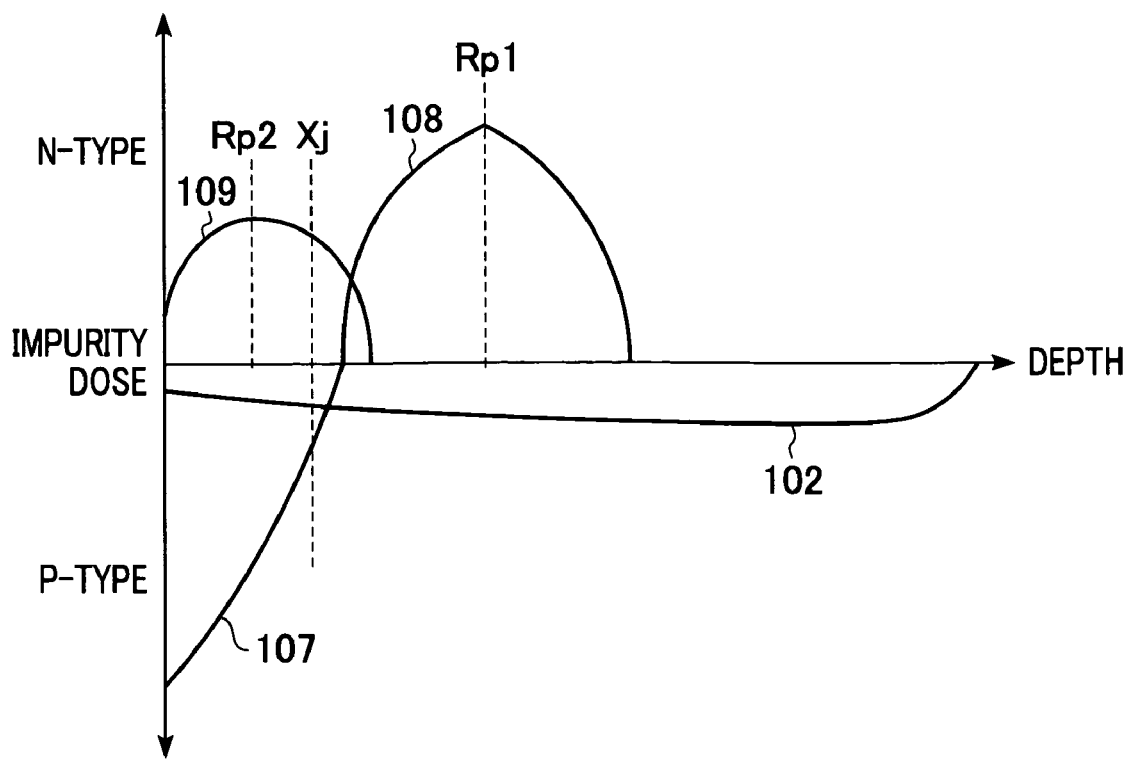
FIG. 1B is a graph showing an impurity concentration distribution at a cross section taken along line A-A' in FIG. 1A.

FIG. 1A is an explanatory view of a solid-state image sensor according to a first embodiment of the present invention, and FIG. 1B is a graph showing an impurity concentration distribution at a cross section taken along line A-A' in FIG. 1A.

Referring to FIG. 1A, a solid-state image sensor of the first embodiment includes, in each pixel, a semiconductor substrate 101, a p-type well region 102, a selective oxide 103, a gate oxide 104, and a transfer gate 105. By turning the transfer gate 105 on, charges in a photodiode are read into an n-type diffusing region 106. The photodiode is of a buried type including a front p-type high-concentration layer 107, an n-type deep accumulation region 108, and an n-type shallow accumulation region 109. Unlike the shallow accumulation region 109, the deep accumulation region 108 does not extend up toward the transfer gate 105. That is, an impurity region of the shallow accumulation region 109 is provided adjacent to the transfer gate 105 and in contact with the gate oxide 104 in the shallow accumulation region 109, and in contrast, the deep accumulation region 108 is not in contact with the gate oxide 104.

In order to achieve the advantages of the present invention, it is preferable that the mean range of ion implantation for the shallow accumulation region 109 be designed to be equivalent to or less than the junction depth of the p-type high-concentration layer 107.

The advantages of the present invention are as follows: The voltage applied to the transfer gate during transfer, and the absolute value of the negative voltage applied to the transfer gate during accumulation can be reduced. Therefore, the power voltage and power consumption are reduced, and the S/N ratio is improved. Moreover, since production stability is enhanced, the ion implantation conditions can be flexibly determined, the occurrence of white spots is reduced, and the yield is increased. Consequently, it is possible to provide an inexpensive and high-definition solid-state image sensor.

The relationship between the mean range and the junction depth is shown in FIG. 1B. The deep accumulation region 108 and the shallow accumulation region 109 in the photodiode are formed by phosphorus ion implantation. The advantages of the present invention are more reliably achieved by satisfying the following condition:

$$Rp2 \leq Xj < Rp1$$

where Rp1 represents the mean range of ion implantation for the deep accumulation region 108, Rp2 represents the mean range of ion implantation for the shallow accumulation region 109, and Xj represents the depth of the junction of the p-type high-concentration layer 107 and the accumulation region of the photodiode (the depth at which the sum of the donor concentrations of the shallow accumulation region 109 and the deep accumulation region 108 equals the sum of the acceptor concentrations of the p-type high-concentration layer 107 and the well region 102). Accordingly, it is possible to reduce both the voltage applied to the transfer gate during transfer and the absolute value of the negative voltage applied to the transfer gate during accumulation.

Since both the deep accumulation region 108 and the shallow accumulation region 109 are n-type semiconductor regions, in actuality, there is no clear boundary therebetween after the completion of the process. However, for the following reasons, the configuration of the present invention is clearly different from that in the related art, and can provide the above-described advantages:

(1) The number of charges that can be accumulated in the photodiode and the bias for complete depletion are highly dependent on the concentration of the deep accumulation region 108, but are minimally dependent on the concentration of the shallow accumulation region 109. This is because the concentration of the p-type high-concentration layer 107 on the front side is sufficiently high, and therefore, the impurity that forms a portion of the shallow accumulation region 109 covered with the p-type high-concentration layer 107 is cancelled by the p-type high-concentration layer 107, and the influence of the concentration is not apparent. For this reason, it is only necessary to review the implantation conditions for the deep accumulation region 108, for example, to correct the tuning and process variations when the process conditions of the photodiode are slightly changed, and to redesign the process conditions according to different product specifications. Consequently, the tuning and design of the photodiode can be performed without increasing the absolute value of the negative voltage applied to the transfer gate during accumulation.

(2) According to the design and investigation of the present inventor, it is preferable that the impurity concentration for the deep accumulation region 108 be two to ten times the impurity concentration for the shallow accumulation region 109. When the deep accumulation region 108 is also formed near the transfer gate 105, the influence of the concentration becomes strong. For this reason, by independently designing the deep accumulation region 108 and the shallow accumulation region 109, high production stability can be achieved, and the ion implantation conditions can be flexibly determined.

A means for carrying out the first embodiment of the present invention will now be described.

Figure 2:
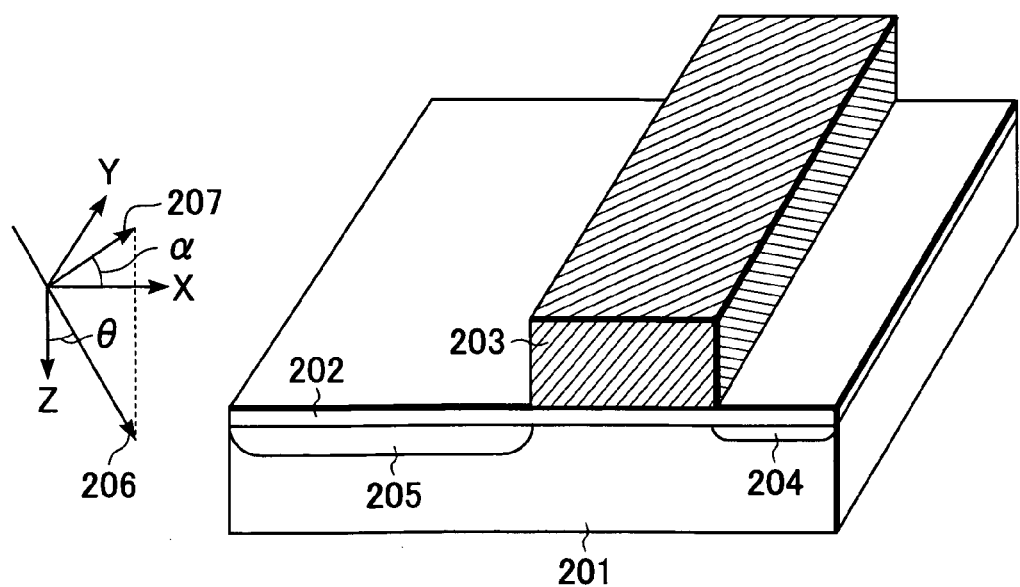
FIG. 2 is an explanatory view showing the definition of the ion implantation direction.

The direction of ion implantation for a pixel pattern will be defined with reference to FIG. 2, which illustrates a semiconductor substrate 201, a gate oxide 202, a transfer gate 203, a diffusion region 204, and a photodiode 205. As shown in FIG. 2, the direction normal to the semiconductor substrate 201 is designated as the Z-axis, the gate length direction of the transfer gate 203 is designated as the X-axis, and the gate width direction of the transfer gate 203 is designated as the y-axis. A vector 206 indicates the direction of ion implantation. The angle θ formed between the vector 206 and the z-axis is defined as a tilt angle, and the angle α formed between a vector 207 that is obtained by projecting the vector 206 onto the xy-plane, and the x-axis is defined as a rotation angle. A case in which α=0° is referred to as ion implantation under the transfer gate, and a case in which α=90° or 270° is referred to as ion implantation parallel to the transfer gate edge.

Figure 3A:
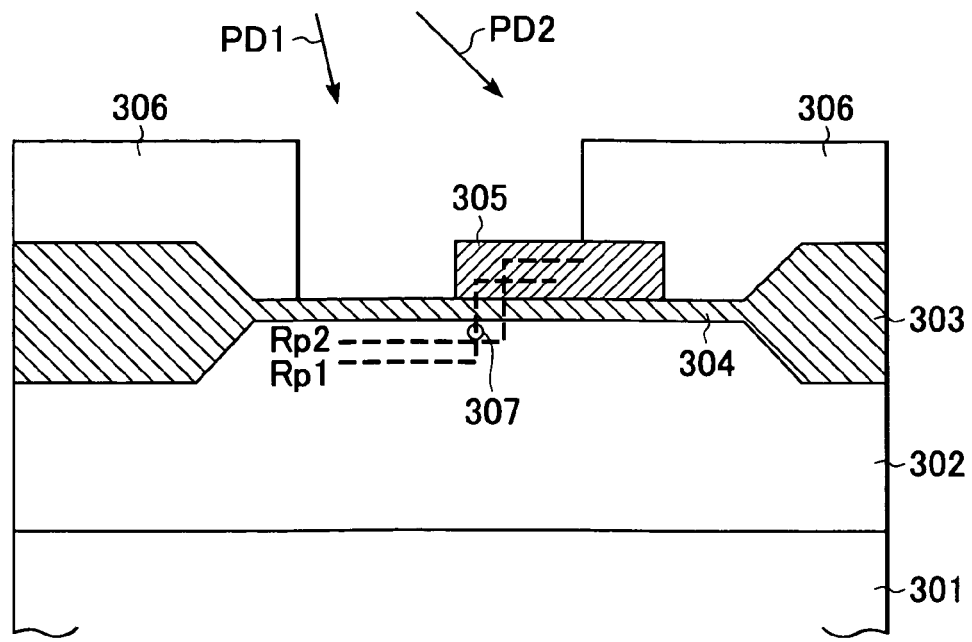
FIG. 3A is an explanatory view showing a known photodiode production method.

FIG. 3A is an explanatory view showing a photodiode production method disclosed in the related art. FIG. 3A illustrates a semiconductor substrate 301, a p-type well region 302, a selective oxide 303, a gate oxide 304, and a transfer gate 305. PD1 represents an implantation vector of ion implantation for a deep accumulation region of a photodiode, and PD2 represents an implantation vector of ion implantation for a shallow accumulation region. While ion implantation for both the accumulation regions may be performed with the same resist pattern 306, they may be separately patterned. In order to explain the portions in which an impurity is implanted, the portions corresponding to the mean range (ridges of contours expressing the impurity concentrations) are denoted by Rp1 and Rp2.

Ion implantation under the gate electrode can be performed along the vector PD2 to ensure the width and concentration of the shallow accumulation region. PD2 is designed, for example, at a tilt angle of 45° (θ=45°).

Ion implantation under the gate electrode is also performed along the vector PD1 at a tilt angle of approximately 7° (θ=7°). In this case, an impurity is implanted into a position 307 under the gate electrode 305. This increases the absolute value of the low-level voltage of the transfer gate. When the ion dose is adjusted to respond to secular changes of the process line and products according to different specifications, the transfer-gate low-level voltage changes. While the edge of the transfer gate 305 is vertical in FIG. 3A for convenience, it is, in actuality, tapered at an angle of approximately 80° to 87°. This further increases or varies the absolute value of the transfer-gate low-level voltage.

Figure 3B:
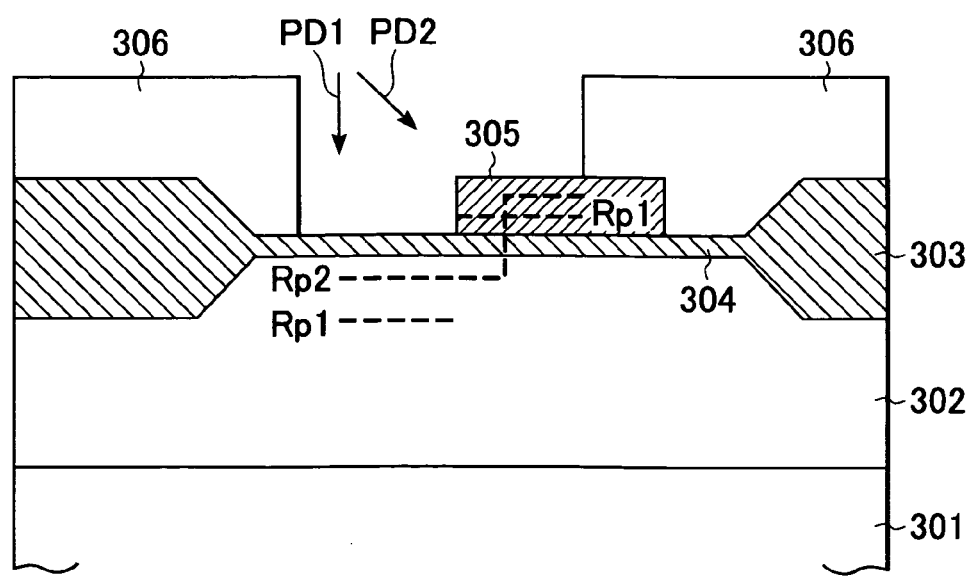
FIG. 3B is an explanatory view showing a photodiode production method according to the present invention.

In the first embodiment of the present invention, in order to overcome the above problems, the rotation angle α is determined so that an x-axis component of the ion implantation vector PD1 is substantially equal to 0. FIG. 3B is an explanatory view showing a photodiode production method according to this embodiment.

In order to prevent channeling, it is not preferable to set the tilt angle at 0° (θ=0°). For this reason, in the first embodiment, ion implantation parallel to the transfer gate 305 is performed while the tilt angle is set at 7° (θ=7°) and the rotation angle of ion implantation is set at 90° or 270° (α=90° or 270°), so that the x-axis component of the ion implantation vector PD1 is substantially 0. FIG. 3B is a cross-sectional view taken along the xz-plane in this case. Herein, the ion implantation vector is projected on the xz-plane. In the first embodiment, portions Rp1 in which an impurity is implanted along the vector PD1 are provided inside and outside the transfer gate 305, but they are not continuous. That is, an impurity region does not extend toward the gate insulating film 304. In this manner, the structure shown in FIG. 1A can be achieved.

According to the above-described production method, the shallow accumulation region 109 extends toward the edge of the transfer gate 105, and the deep accumulation region 108 does not extend toward the end of the transfer gate 105, as shown in FIG. 1A. However, even when the above production method is used, the deep accumulation region 108 sometimes extends under the transfer gate 105 through the edge, depending on the impurity material and the thermal diffusion condition. Furthermore, the deep accumulation region 108 sometimes may extend under the transfer gate 105 to an extent such as not to cause a problem, for example, a marked increase in dark current. Therefore, the present invention also covers those cases.

In the above production method, it is preferable that the rotation angle $\alpha$ for the shallow accumulation region 109 satisfy $0° \leq \alpha < 90°$ and $270° < \alpha \leq 360°$ in order for the shallow accumulation region 109 to extend under the transfer gate 105, and it is preferable that the rotation angle $\alpha$ for the deep accumulation region 108 satisfy $90° \leq \alpha \leq 270°$ in order for the deep accumulation region 108 not to extend under the transfer gate 105. In a case in which the deep accumulation region 108 is permitted to extend under the transfer gate 105 to some extent, ion implantation may be performed under the condition that the rotation angle $\alpha$ is outside the range of 90° to 270°.

Second Embodiment

While the deep accumulation region and the shallow accumulation region in the photodiode are formed by phosphorus implantation in the first embodiment, a deep accumulation region in a photodiode may be formed by arsenic implantation, as in a second embodiment.

Figure 4:
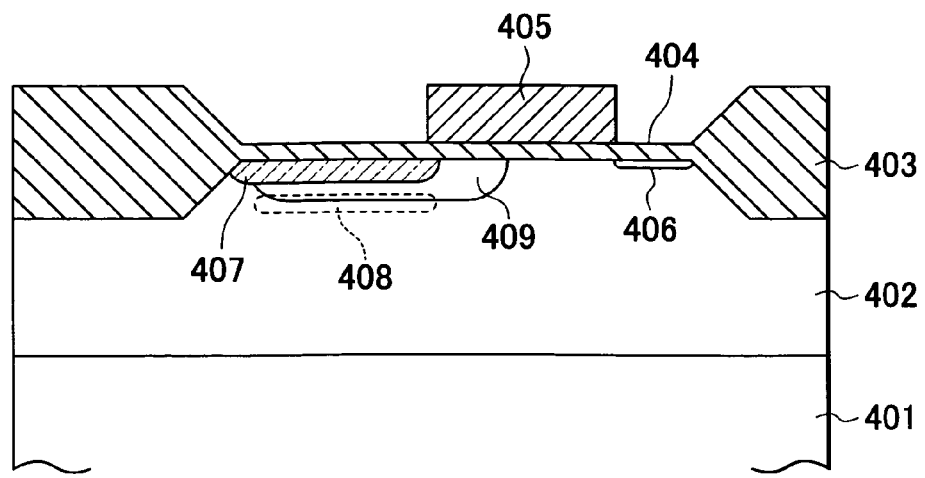
FIG. 4 is an explanatory view showing a second embodiment of the present invention.

The second embodiment of the present invention will be described with reference to FIG. 4. A solid-state image sensor of the second embodiment includes, in each pixel, a semiconductor substrate 401, a p-type well region 402, a selective oxide 403, a gate oxide 404, and a transfer gate 405. By turning the transfer gate 405 on, charges in a photodiode are read into an n-type diffusion region 406. The photodiode is of a buried type, including a front p-type high-concentration layer 407, an n-type deep accumulation region 408, and an n-type shallow accumulation region 409. In the second embodiment, the deep accumulation region 408 is formed by arsenic implantation. Since arsenic has a thermal diffusion constant lower than that of phosphorus, diffusion by heat energy applied during the production process is suppressed. Therefore, arsenic implantation allows the deep accumulation region 408 to be more sharply formed with a higher concentration. This achieves a higher saturation output with a lower depletion voltage. The number of signal charges capable of being accumulated in a pixel is substantially equal to the integral value of the donor concentration in the accumulation region of the photodiode. For this reason, the high concentration of the accumulation region effectively increases the number of accumulated signal charges, and also increases the saturation output of the sensor and the dynamic range of the sensor.

However, when the concentration of the accumulation region in the photodiode is increased, the complete depletion voltage of the photodiode is increased, and the transfer gate voltage necessary for a reset operation for discharging free electrons in the accumulation region and a signal charge transfer operation is increased. In order to limit the increases, it is effective to form the deep accumulation region 408 with a smaller width and with a higher concentration. The complete depletion voltage is a function of the concentration, and also a function of the width of the depletion layer. That is, by reducing the width of the depletion layer during complete depletion, the complete depletion voltage can be reduced without changing the electric field. Accordingly, since the deep accumulation region can be formed in a desired shape in the second embodiment, even when the integrated concentration is set at a high value, the increase in depletion voltage can be limited, and the power voltage can be reduced while increasing the dynamic range of the sensor.

Third Embodiment

While the deep accumulation region and the shallow accumulation region in the photodiode are formed by phosphorus implantation in the first embodiment, a shallow accumulation region of a photodiode may be formed by arsenic implantation, as in a third embodiment.

Figure 5:
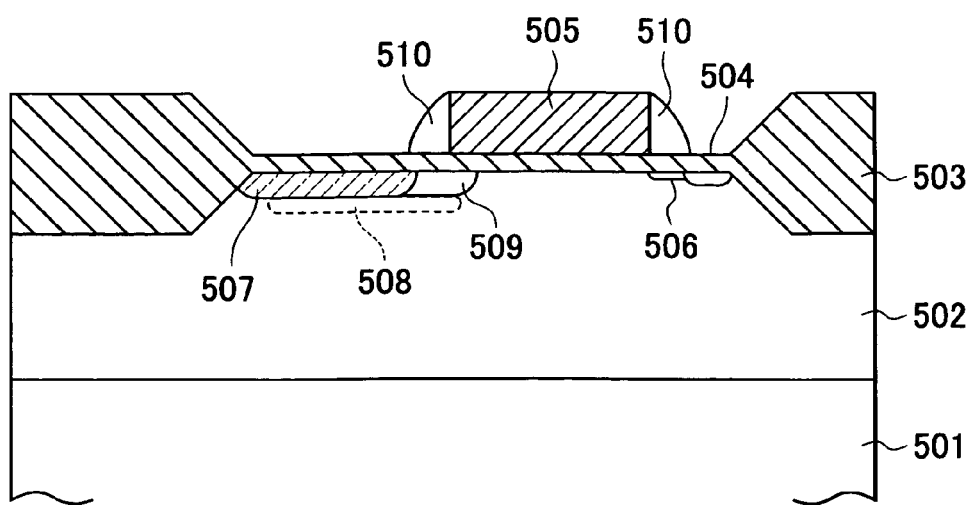
FIG. 5 is an explanatory view showing a third embodiment of the present invention.

The third embodiment of the present invention will be described with reference to FIG. 5. Referring to FIG. 5, a solid-state image sensor of the third embodiment includes, in each pixel, a semiconductor substrate 501, a p-type well region 502, a selective oxide 503, a gate oxide 504, and a transfer gate 505. By turning the transfer gate 505 on, charges in a photodiode are read into an n-type diffusion region 506. The photodiode is of a buried type including a front p-type high-concentration layer 507, an n-type deep accumulation region 508, and an n-type shallow accumulation region 509. In the third embodiment, the shallow accumulation region 509 is formed by arsenic implantation. Since the thermal diffusion constant of arsenic is low, diffusion in the depth direction is suppressed in the shallow accumulation region 509, and the concentration is high at a relatively shallow portion. Therefore, in a portion the p-type high-concentration layer 507 is formed, the n-type impurity in the shallow accumulation region 509 is cancelled by the p-type high-concentration layer 507, and the influence of the ion dose for the shallow accumulation region 509 on the depletion voltage is reduced. The third embodiment is more effective when ion implantation for the shallow accumulation region 509 is performed with the same mask pattern as that for the deep accumulation region 508.

Another technique for carrying out the third embodiment will be described. When the shallow accumulation region 509 is formed by arsenic implantation, the width of a charge transfer region is sometimes insufficient because the thermal diffusion constant of arsenic is low. For this reason, in the third embodiment, the p-type high-concentration layer 507 is provided separate from the transfer gate 505. More specifically, a method similar to the method for producing an LDD (lightly doped drain) structure of a MOS transistor may be adopted. The p-type high-concentration layer 507 can be formed separately from the transfer gate 505 by performing implantation with a side spacer 510 provided on a side wall of the transfer gate 505.

In the second and third embodiments described above, the accumulation region is made of arsenic. In this case, the following advantages can be provided, besides the above-described advantages: When the shallow accumulation region or the deep accumulation region in the photodiode is made of arsenic, lattice distortion applied to a silicon lattice is reduced, compared with a case in which the accumulation region is made of phosphorus. As a result, the number and severity of white spots are reduced. A photodiode may be formed by combining the arsenic implantation technique for the deep accumulation region and the arsenic implantation technique for the shallow accumulation region. When both accumulation regions are made of arsenic, the number of white spots can be reduced considerably.

Fourth Embodiment

In the above third embodiment, the offset technique using the side spacer is adopted to locate the p-type high-concentration layer apart (separate) from the transfer gate. In a fourth embodiment, a method is used which allows the width of a charge-transfer region to be freely designed without any influence on other MOS characteristics.

Figure 6:
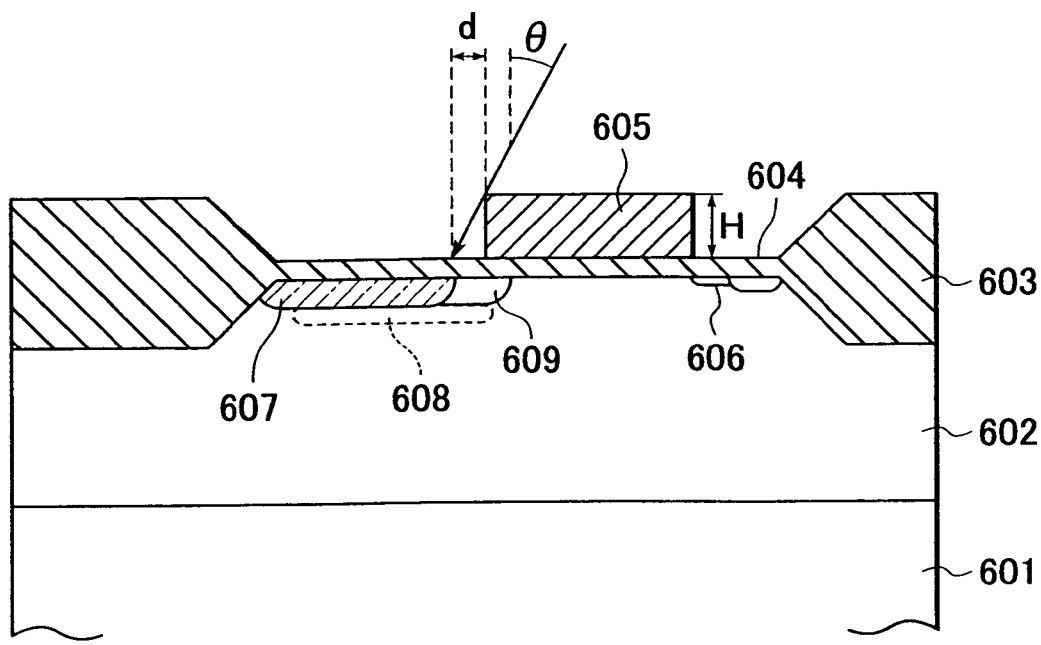
FIG. 6 is an explanatory view showing a fourth embodiment of the present invention.
Figure 7:
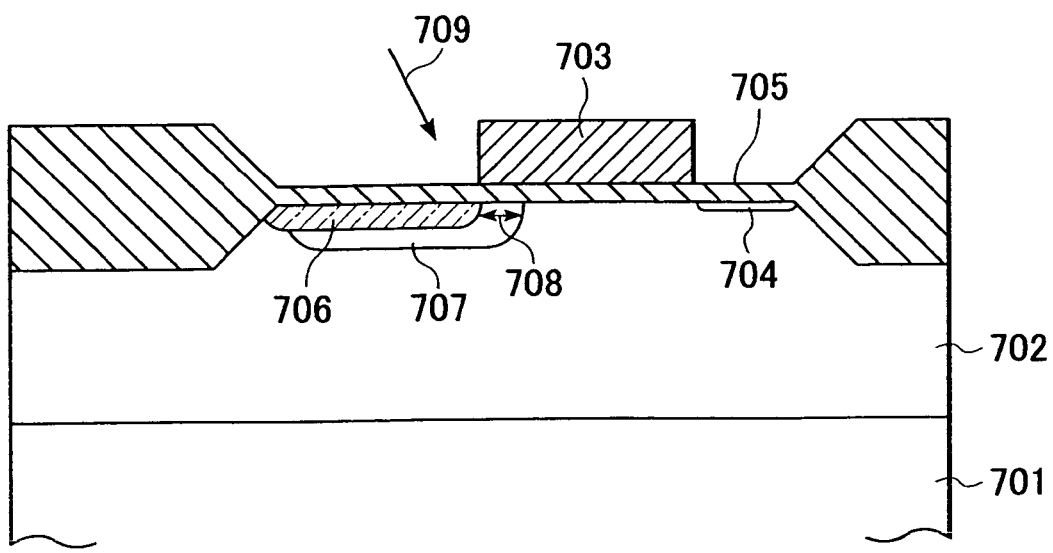
FIG. 7 is an explanatory view showing the related art.

FIG. 6 is an explanatory view of the fourth embodiment. Referring to FIG. 6, a solid-state image sensor of the fourth embodiment includes, in each pixel, a semiconductor substrate 601, a p-type well region 602, a selective oxide 603, a gate oxide 604, and a transfer gate 605. By turning the transfer gate 605 on, charges in a photodiode are read into an n-type diffusion region 606. The photodiode is of a buried type including a front p-type high-concentration layer 607, an n-type deep accumulation region 608, and an n-type shallow accumulation region 609. In the fourth embodiment, ion implantation for the p-type high-concentration layer 607 is performed with a rotation angle of 180°. As a result, a portion in which the p-type high-concentration layer 607 is not provided, that is, an offset portion, can be formed adjacent to the transfer gate 605 in a self-alignment manner because of shadowing of the transfer gate 605. By arbitrarily determining the tilt angle for ion implantation, the offset amount ("d" in FIG. 6) between the p-type high-concentration layer 607 and the transfer gate 605 can be designed, and the width of a bypass region can be arbitrarily determined. The offset amount d satisfies the following condition:

$$d = H \cdot \tan(\theta)$$

where H represents the height of the transfer gate 605, and θ represents the tilt angle. Accordingly, the width of the charge-transfer region can be controlled by adjusting the tilt angle.

In this way, the width of the charge-transfer region can be freely designed without exerting any influence on other device characteristics.

Fifth Embodiment

In the above-described first to fourth embodiments, the accumulation regions of the photodiode are of an n-type, that is, of an electron accumulation type. The advantages of the present invention are also effective for a hole storage type, and can be provided by inverting the polarity of the impurity. In this case, B or BF2 may be implanted for the deep accumulation region and the shallow accumulation region, and the front highly doped layer (n-layer in this case) may be composed of phosphorus or arsenic. The merits of the use of arsenic are similar to those obtained in the above embodiments, that is, the design performance is enhanced and the occurrence of white spots is reduced because of a low diffusion constant.

Sixth Embodiment

A description will be given of an image-capturing system using the solid-state image sensor described in any of the first to fifth embodiments. A case in which the solid-state image sensor of the present invention is applied to a camera will be described in detail with reference to FIG. 8.

Figure 8:
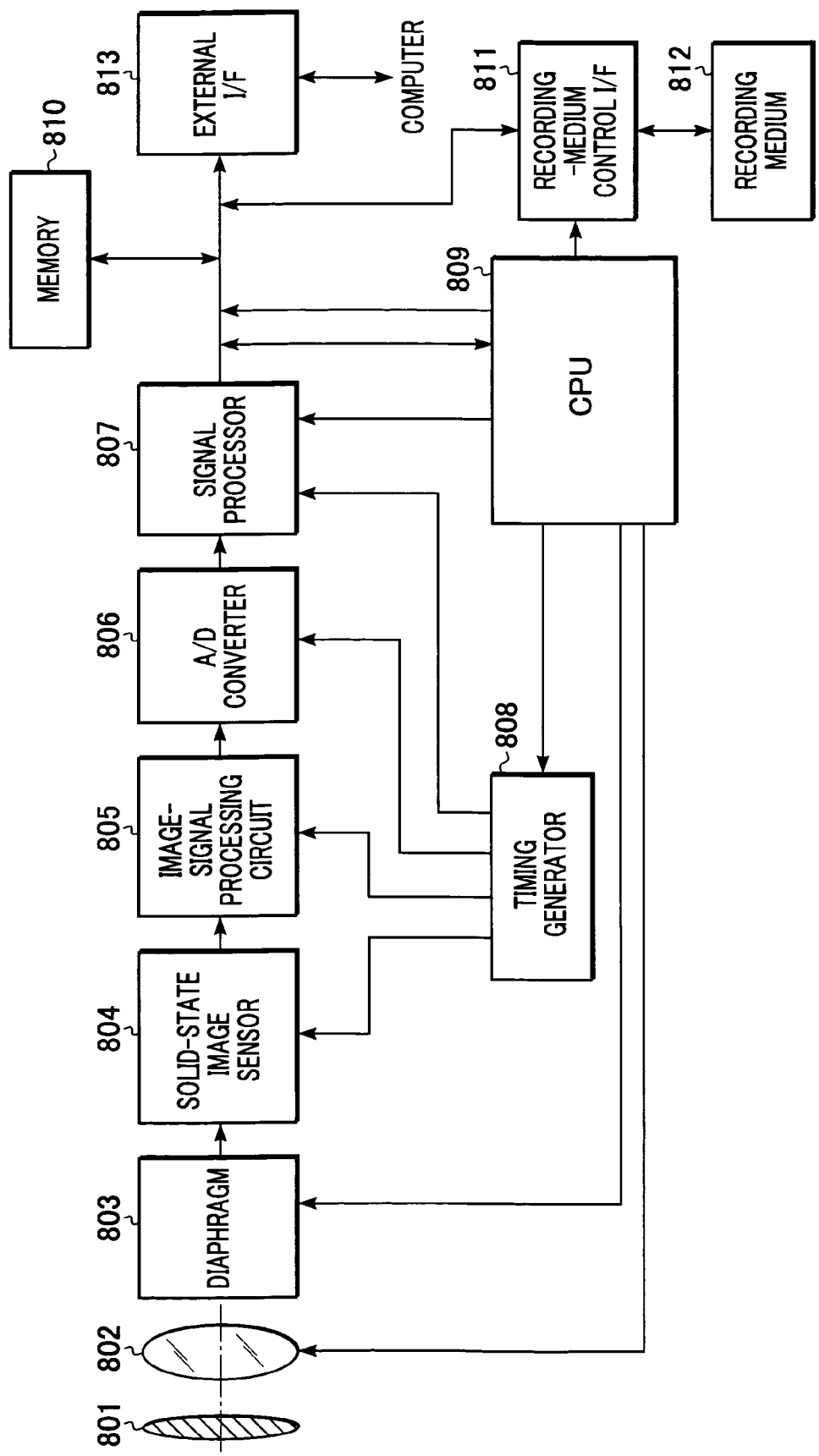
FIG. 8 is a block diagram of an image-pickup system using a solid-state image sensor of the present invention.

Referring to FIG. 8, an image-pickup system includes a barrier 801 serving as both a lens protection and a main switch, a lens 802 for forming an optical image of a subject on a solid-state image sensor 804, a diaphragm 803 for controlling the amount of light passing through the lens 802, a solid-state image sensor 804 for capturing the optical image of the subject formed by the lens 802 as image signals, an image-signal processing circuit 805 including, for example, a gain variable amplifier for amplifying the image signals output from the solid-state image sensor 804 and a gain correction circuit for correcting the gain, an A/D converter 806 for subjecting the image signals output from the solid-state image sensor 804 to analog-to-digital conversion, a signal processor 807 for subjecting image data output from the A/D converter 806 to various correction and compression operations, a timing generator 808 for outputting various timing signals to the solid-state image sensor 804, the image-signal processing circuit 805, the A/D converter 806, and the signal processor 807, a central processing unit 809 for performing various calculations and controlling the entire camera, a memory 810 for temporarily storing image data, a recording-medium control interface 811 for performing recording on and reading from a recording medium, a detachable recording medium 812, such as a semiconductor memory, on which or from which image data is recorded or read, and an external interface 813 for communication with an external computer or the like.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A solid state image sensor comprising in each pixel:
   a semiconductor region of a first conductive type provided on a semiconductor substrate;
   a photodiode provided in the semiconductor region;
   a transfer gate for transferring photocharges accumulated in the photodiode; and
   a diffusion region for receiving the transferred photocharges,
   wherein the photodiode includes a first accumulation region composed of a semiconductor of a second conductive type and a second accumulation region provided in contact with the first accumulation region, at a position deeper in a depth direction than the first accumulation region, and composed of a semiconductor of the second conductive type, and
   wherein the first accumulation region comprises a portion extending toward an end of the transfer gate, and the second accumulation region extends along the first accumulation region, except for the portion extending toward the end of the transfer gate, in a direction transverse to the depth direction,
   wherein the semiconductor region serves as a first semiconductor region, and a second semiconductor region of the first conductive type is provided on a front side of the photodiode and in contact with the first accumulation region, and
   wherein the following condition is satisfied:

$$Rp2 \leq Xj$$

where Rp2 represents the mean range of ion implantation for the first accumulation region, and Xj represents the depth of the junction between the first accumulation region and the second semiconductor region.

2. A solid-state image sensor according to claim 1, wherein the following condition is satisfied:

$$Rp2 \leq Xj < Rp1$$

where Rp1 represents the mean range of ion implantation for the second accumulation region.

3. A solid state image sensor comprising in each pixel:
a semiconductor region of a first conductive type provided on a semiconductor substrate;
a photodiode provided in the semiconductor region;
a transfer gate for transferring photocharges accumulated in the photodiode; and
a diffusion region for receiving the transferred photocharges,
wherein the photodiode includes a first accumulation region composed of a semiconductor of a second conductive type and a second accumulation region provided in contact with the first accumulation region, at a position deeper in a depth direction than the first accumulation region, and composed of a semiconductor of the second conductive type, and
wherein the first accumulation region comprises a portion extending toward an end of the transfer gate, and the second accumulation region extends along the first accumulation region, except for the portion extending toward the end of the transfer gate, in a direction transverse to the depth direction,
wherein the impurity concentration of the second accumulation region differs from that of the first accumulation region.

4. A solid-state image sensor according to claim 3, wherein the impurity concentration of the second accumulation region is greater than that of the first accumulation region.

5. A solid-state image sensor according to claim 3, wherein the impurity concentration of the second accumulation region is 2 to 10 times that of the first accumulation region.

6. A solid-state image sensor comprising a plurality of pixels, each pixel comprising:
a photoelectric conversion element having a first semiconductor region of a first conductive type arranged in a semiconductor substrate, and a second semiconductor region of a second conductive type for accumulating carriers generated by photoelectric conversion;
a transfer gate for transferring the carriers accumulated in the second semiconductor region; and
a diffusion region for receiving the carriers transferred by said transfer gate,
wherein the second semiconductor region comprises a first accumulation region and a second accumulation region arranged deeper in a depth direction than the first accumulation region, at least a part of the first accumulation region being arranged under said transfer gate, and
wherein the impurity concentration of the second accumulation region is greater than that of the first accumulation region.

7. A camera comprising the solid-state image sensor according to claim 6.

* * * * *

UNITED STATES PATENT AND TRADEMARK OFFICE
CERTIFICATE OF CORRECTION

PATENT NO. : 7,227,206 B2  Page 1 of 1
APPLICATION NO. : 10/842443
DATED : June 5, 2007
INVENTOR(S) : Watanabe It is certified that error appears in the above-identified patent and that said Letters Patent is hereby corrected as shown below:

ON THE TITLE PAGE:
At Item (56), References Cited, Foreign Patent Documents, "JP 2000-091552 A 11/1998 .... 27/146" should be deleted.

COLUMN 3:
Line 17, "where a" should read --where $\alpha$--.

COLUMN 9:
Line 53, "BF2" should read --$BF_2$--.

COLUMN 10:
Line 41, "solid state" should read --solid-state--.

COLUMN 11:
Line 12, "solid state" should read --solid-state--.

Signed and Sealed this

Sixth Day of January, 2009

JON W. DUDAS
*Director of the United States Patent and Trademark Office*